(12) United States Patent
Kang (10) Patent No.: US 11,575,067 B2
(45) Date of Patent: Feb. 7, 2023

(54) DISPLAY SUBSTRATE, DISPLAY APPARATUS, AND MANUFACTURING METHOD FOR DISPLAY SUBSTRATE

(71) Applicant: BOE TECHNOLOGY GROUP CO., LTD., Beijing (CN)

(72) Inventor: Zhao Kang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 198 days.

(21) Appl. No.: 16/647,940

(22) PCT Filed: May 13, 2019

(86) PCT No.: PCT/CN2019/086683
§ 371 (c)(1),
(2) Date: Mar. 17, 2020

(87) PCT Pub. No.: WO2019/223567
PCT Pub. Date: Nov. 28, 2019

(65) Prior Publication Data
US 2020/0274023 A1    Aug. 27, 2020

(30) Foreign Application Priority Data

May 24, 2018 (CN) .......................... 201810510492.7

(51) Int. Cl.
| | | |
|---|---|---|
| *H01L 27/15* | (2006.01) | |
| *H01L 29/26* | (2006.01) | |
| *H01L 31/12* | (2006.01) | |
| *H01L 33/00* | (2010.01) | |
| *H01L 33/34* | (2010.01) | |
| *H01L 33/50* | (2010.01) | |
| *H01L 33/62* | (2010.01) | |

(52) U.S. Cl.
CPC ........ *H01L 33/0054* (2013.01); *H01L 27/156* (2013.01); *H01L 33/0093* (2020.05);
(Continued)

(58) Field of Classification Search
CPC .............. H01L 33/0054; H01L 27/156; H01L 33/0093; H01L 33/34; H01L 33/502;
(Continued)

(56) References Cited

U.S. PATENT DOCUMENTS

| | | | |
|---|---|---|---|
| 2013/0037816 A1 | 2/2013 | Tomiyasu et al. | |
| 2015/0001490 A1* | 1/2015 | Lee ................... | H01L 29/78636 438/151 |

(Continued)

FOREIGN PATENT DOCUMENTS

| | | |
|---|---|---|
| CN | 102714138 A | 10/2012 |
| CN | 103855179 A | 6/2014 |

(Continued)

OTHER PUBLICATIONS

International Search Report of PCT/CN2019/086683 in Chinese, dated Aug. 16, 2019, with English translation.

*Primary Examiner* — Ismail A Muse
(74) *Attorney, Agent, or Firm* — Collard & Roe, P.C.

(57) ABSTRACT

A display substrate, a display apparatus, and a manufacturing method for the display substrate are provided. The display substrate includes: a substrate and a plurality of pixel units arranged in an array on the substrate; the pixel unit includes a light emitting diode, a connecting metal pattern, and a thin film transistor arranged in sequence along a direction away from the substrate; the connecting metal pattern is conductively connected to a top electrode of the light emitting diode; an active layer of the thin film transistor is insulated and spaced from the connecting metal pattern, and the drain of the thin film transistor is conductively connected to the connecting metal pattern.

18 Claims, 5 Drawing Sheets

(52) U.S. Cl.
CPC ............ H01L 33/34 (2013.01); H01L 33/502 (2013.01); H01L 33/62 (2013.01); *H01L 2933/0016* (2013.01); *H01L 2933/0041* (2013.01); *H01L 2933/0066* (2013.01)

(58) Field of Classification Search
CPC ............ H01L 33/62; H01L 2933/0016; H01L 2933/0041; H01L 2933/0066; H01L 25/167; H01L 33/507
See application file for complete search history.

(56) References Cited

U.S. PATENT DOCUMENTS

| | | | |
|---|---|---|---|
| 2017/0025399 A1* | 1/2017 | Takeya | H05B 33/14 |
| 2017/0062674 A1* | 3/2017 | Kwon | H01L 33/60 |
| 2017/0069611 A1* | 3/2017 | Zhang | H01L 25/0753 |
| 2017/0154571 A1* | 6/2017 | Gu | G09G 3/2074 |
| 2017/0179097 A1* | 6/2017 | Zhang | H01L 27/124 |
| 2017/0179192 A1* | 6/2017 | Zhang | H01L 25/075 |
| 2017/0194413 A1* | 7/2017 | Nagasawa | H01L 51/0031 |
| 2020/0274023 A1 | 8/2020 | Kang | |
| 2020/0292878 A1* | 9/2020 | Sekiguchi | G02F 1/1323 |
| 2021/0327865 A1* | 10/2021 | Yamazaki | G09F 9/00 |

FOREIGN PATENT DOCUMENTS

| | | | |
|---|---|---|---|
| CN | 108493209 A | 9/2018 | |
| KR | 10-2013-0137985 A | 12/2013 | |
| WO | 2016/015174 A1 | 2/2016 | |

* cited by examiner

FIG.15

DISPLAY SUBSTRATE, DISPLAY APPARATUS, AND MANUFACTURING METHOD FOR DISPLAY SUBSTRATE

CROSS REFERENCE TO RELATED APPLICATIONS

This application is the National Stage of PCT/CN2019/086683 filed on May 13, 2019, which claims priority under 35 U.S.C. § 119 of Chinese Application No. 201810510492.7 filed on May 24, 2018, the disclosure of which is incorporated by reference.

TECHNICAL FIELD

The disclosure relates to a display substrate, a display apparatus, and a manufacturing method of a display substrate.

BACKGROUND

The Micro Light Emitting Diode (Micro-LED) technology, i.e. the light emitting diode miniaturization and matrixization technology, refers to a high-density micro-sized LED array integrated on a chip. For example, each pixel of an LED display screen can be addressed and driven individually. It can be deemed as the miniature of an outdoor LED display screen, and reduces a pixel distance from a millimeter level to a micron level.

The advantages of the Micro-LED are obvious. It has the characteristics of high efficiency, high brightness, high reliability, and fast response time, etc. of the inorganic LED. Furthermore, it has the characteristics of self-luminous without a backlight, and thus possesses the advantages of more energy-saving, simple structure, small size and thin thickness, etc. In addition, because the Micro-LED is extremely small, it exhibits an ultra-high resolution.

Compared with the OLED (Organic Light Emitting Diode), the Micro-LED can be adjusted more easily and accurately in color, and has the advantages of longer luminous life, higher brightness, better material stability, long lifetime, and no image artifacts etc. Consequently, in addition to the OLED, it is a display technology having the advantages of small size and thin thickness as well as saving electricity.

SUMMARY

At least one embodiment of the disclosure provides a manufacturing method of a display substrate comprising: forming a light emitting diode and a first metal layer covering the light emitting diode in sequence on a first base substrate; forming an active material layer and a second metal layer in sequence on a second base substrate; bonding the first metal layer on the first base substrate and the second metal layer on the second base substrate with them facing each other; stripping off the second base substrate; patterning the first metal layer and the second metal layer to form a connection metal pattern to be electrically connected to a top electrode of the light emitting diode; and forming a thin film transistor on the first base substrate, wherein an active layer of the thin film transistor is formed by patterning the active material layer, and a drain electrode of the thin film transistor is electrically connected to the connection metal pattern.

In some examples, forming the light emitting diode on the first base substrate comprises epitaxially growing a light emitting layer on the first base substrate.

In some examples, the light emitting layer comprises an inorganic semiconductor material.

In some examples, an area of the connection metal pattern is smaller than an area of the top electrode of the light emitting diode.

In some examples, forming the thin film transistor on the first base substrate comprises patterning the active material layer to form the active layer; forming a gate insulation layer on the active layer; forming a gate electrode on the gate insulation layer; forming an interlayer insulation layer on the gate electrode; forming a first via hole and a second via hole for connecting to the active layer and a third via hole for connecting to the connection metal pattern, in the gate insulation layer and the interlayer insulation layer; forming a source electrode and the drain electrode on the interlayer insulation layer. The source electrode is connected to the active layer through the first via hole, and the drain electrode is connected to the active layer through the second via hole and is connected to the connection pattern through the third via hole.

In some examples, forming the thin film transistor on the first base substrate comprises: patterning the active material layer to form the active layer; forming a drain electrode to be connected to the active layer and the connection metal pattern; forming a gate insulation layer on the drain electrode; forming a gate electrode on the gate insulation layer; forming an interlayer insulation layer on the gate electrode; forming a first via hole for connecting to the active layer, in the gate insulation layer and the interlayer insulation layer; and forming a source electrode on the interlayer insulation layer. The source electrode is connected to the active layer through the first via hole.

In some examples, the manufacturing method further comprises forming a buffer layer between the active material layer and the second metal layer on the second base substrate, wherein the buffer layer and the active material layer are simultaneously patterned to form a buffer layer pattern, and the active layer is insulated from the connection metal pattern by the buffer layer pattern.

In some examples, the manufacturing method further comprises: forming a first planarization layer on the thin film transistor; and forming a light conversion layer on the first planarization layer.

In some examples, the light conversion layer comprises a white fluorescent layer and a filter layer disposed in sequence on the first planarization layer, and the filter layer comprises a plurality of color filters with different colors.

In some examples, the light conversion layer comprises a quantum dot structure layer, and the quantum dot material structure layer comprises a plurality of color light regions provided with quantum dot materials with different colors.

In some examples, the manufacturing method further comprises forming a second planarization layer on the light conversion layer.

At least one embodiment of the disclosure provides a base substrate and a plurality of pixel units disposed on the base substrate, wherein at least one of the plurality of the pixel units comprises a light emitting diode, a connection metal pattern, and a thin film transistor disposed in sequence in a direction away from the base substrate; the connection metal pattern is electrically connected to a top electrode of the light emitting diode; an active layer of the thin film transistor is spaced and insulated from the connection metal pattern, and a drain electrode of the thin film transistor is electrically connected to the connection metal pattern.

In some examples, the thin film transistor is a low temperature polysilicon thin film transistor.

In some examples, the low temperature polysilicon thin film transistor comprises: a low temperature polysilicon active layer, a gate insulation layer, a gate electrode, an interlayer insulation layer, source and drain electrodes disposed in sequence in a direction away from the connection metal pattern, wherein the source electrode is connected to the low temperature polysilicon active layer through a first via hole in the gate insulation layer and the interlayer insulation layer; the drain electrode is connected to the low temperature polysilicon active layer through a second via hole in the gate insulation layer and the interlayer insulation layer, and the drain electrode is electrically connected to the connection metal pattern through a third via hole in the gate insulation layer and the interlayer insulation layer.

In some examples, the low temperature polysilicon thin film transistor comprises: a low temperature polysilicon active layer, a gate insulation layer, a drain electrode, a gate electrode, an interlayer insulation layer, and a source electrode disposed in sequence in a direction away from the connection metal pattern, wherein the source electrode is connected to the low temperature polysilicon active layer through a first via hole in the gate insulation layer and the interlayer insulation layer; the drain electrode is disposed on a side of the connection metal pattern away from the low temperature polysilicon active layer and is electrically connected to the connection metal pattern.

In some examples, the display substrate further comprises: a first planarization layer and a light conversion layer disposed in sequence in a direction away from the thin film transistor.

In some examples, the light conversion layer comprises a white fluorescent layer and a filter layer disposed in sequence on the first planarization layer, and the filter layer comprises a plurality of color filters with different colors.

In some examples, the light conversion layer comprises a quantum dot structure layer, and the quantum dot material structure layer comprises a plurality of color light regions provided with quantum dot materials with different colors.

In some examples, the light emitting diode is a blue light emitting diode.

At least one embodiment of the disclosure provides a display apparatus comprising the display substrate of any one of the above display substrates.

BRIEF DESCRIPTION OF THE DRAWINGS

In order to clearly illustrate the technical solution of the embodiments of the disclosure, the drawings of the embodiments will be briefly described in the following. It is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Because an epitaxial layer is needed during manufacturing the Micro-LED device, the manufacturing process of the epitaxial layer is strict and the epitaxial layer can only be produced on a silicon wafer or a sapphire, it is difficult to directly produce an LED on a thin film transistor control circuit. In the manufacturing process of most of the current Micro-LED devices, the LED and the thin film transistor control circuit are manufactured separately and then are aligned and attached. Because a certain degree of accuracy will be lost due to the alignment and the attaching, it is disadvantage to manufacture a display panel with high resolution.

In order to improve a product yield of the display substrate and a resolution of the display apparatus, embodiments of the disclosure provide a display substrate, a display apparatus, and a manufacturing method of a display substrate.

Figure 7:
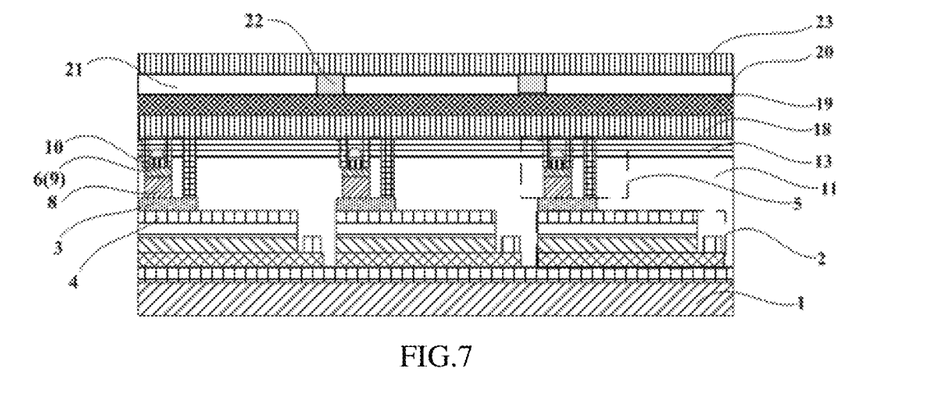
FIG. 7 is a schematic structural diagram of a display substrate according to further another embodiment of the disclosure.
Figure 12:
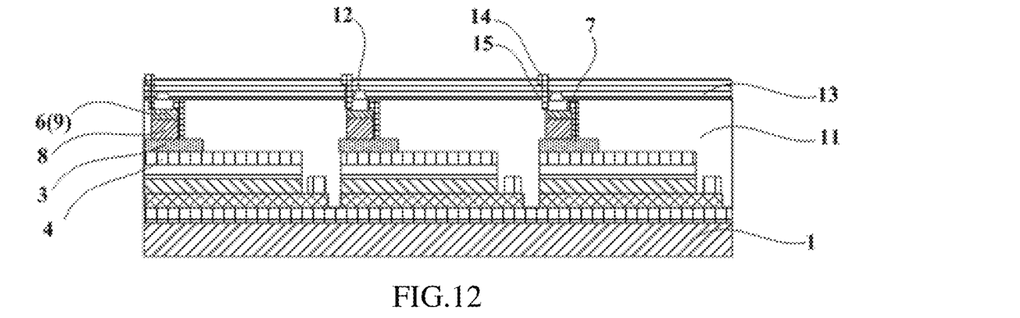
FIG. 12 is a schematic structural diagram of a display substrate according to another embodiment of the disclosure.

As shown in FIGS. 7 and 12, a display substrate provided by an embodiment of the disclosure comprises: a base substrate 1 and a plurality of pixel units arranged on the substrate 1 in an array. Each of the pixel units comprises a light emitting diode 2, a connection metal 3, and a thin film transistor 5 disposed in sequence in a direction away from the base substrate 1. The connection metal 3 is electrically connected to a top electrode 4 of the light emitting diode 2.

An active layer 6 of the thin film transistor 5 is spaced and insulated from the connection metal 3, and a drain electrode 7 of the thin film transistor 5 is electrically connected to the connection metal 3. The light emitting diode 2 is a micro light emitting diode.

According to the display substrate of the technical solution, the light emitting diode 2 is manufactured on the base substrate 1, and thus when the thin film transistor 5 of the display substrate is manufactured, a base substrate for the thin film transistor 5 which active layer has not been patterned is directly attached to the base substrate for the light emitting diode 2, and then the thin film transistor 5 is manufactured on the light emitting diode 2. Because the connection metal 3 is electrically connected to the top electrode 4 of the light emitting diode 2 and a drain electrode 7 of the thin film transistor 5 is electrically connected to the connection metal 3, the drain electrode 7 of the thin film transistor 5 is electrically connected to the top electrode 4 of the light emitting diode 2. In manufacturing the display substrate of the technical solution, the finished light emitting diode 2 and the thin film transistor 5 are not required to be aligned and attached. In this way, the loss of the alignment accuracy can be avoided, so that a size of the light emitting diode 2 can be made smaller to produce a display apparatus with super-high-resolution.

Figure 8:
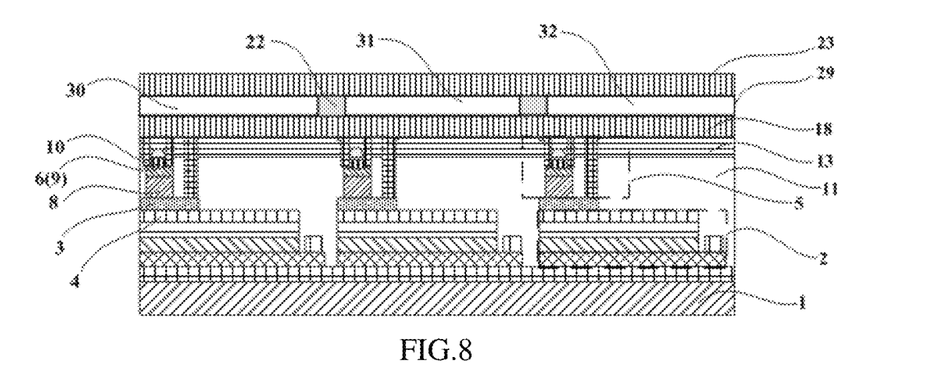
FIG. 8 is a schematic structural diagram of a display substrate according to an embodiment of the disclosure.

As shown in FIGS. 7 and 8, in an optional embodiment of the disclosure, a specific type of the thin film transistor 5 is not limited, and can be, for example, a low temperature polysilicon thin film transistor.

Optionally, the low temperature polysilicon thin film transistor comprises a first buffer layer 8, a low temperature polysilicon active layer 9, a second buffer layer 10, a gate insulation layer 11, a gate electrode 12 (refer to FIG. 6), an interlayer insulation layer 13, a source electrode 14, and a drain electrode 7 disposed in sequence in a direction away from the connection metal 3.

The source electrode 14 is connected to the low temperature polysilicon active layer 9 by a first via hole 15 in the gate insulation layer 11 and the interlayer insulation layer 13 (refer to FIG. 6), the drain electrode 7 is connected to the low temperature polysilicon active layer 9 by a second via hole 16 in the gate insulation layer 11 and interlayer insulation layer 13, and the drain electrode 7 is electrically connected to the connection metal 3 by a third via hole in the gate insulation layer 11 and the interlayer insulation layer 13.

Figure 13:
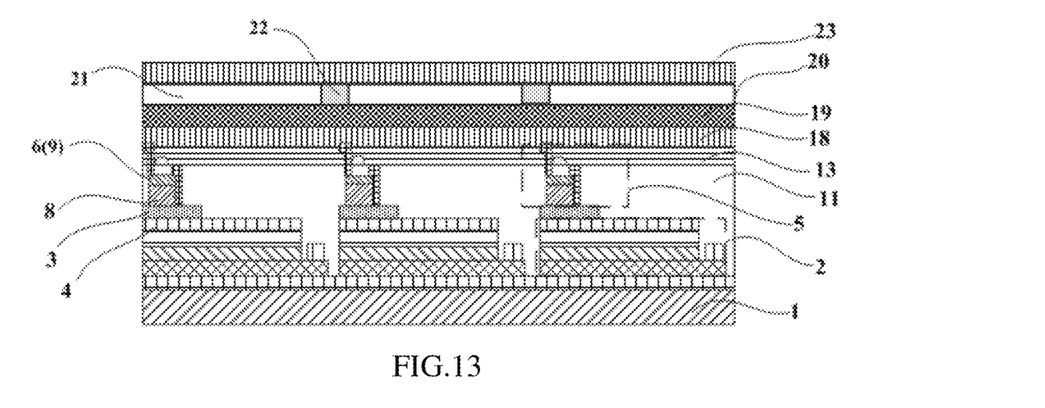
FIG. 13 is a schematic structural diagram of a display substrate according to further another embodiment of the disclosure.
Figure 14:
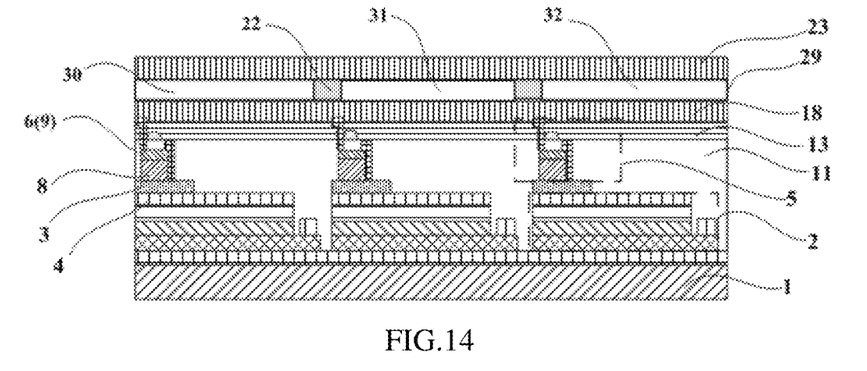
FIG. 14 is a schematic structural diagram of a display substrate according to an embodiment of the disclosure.
Figure 15:
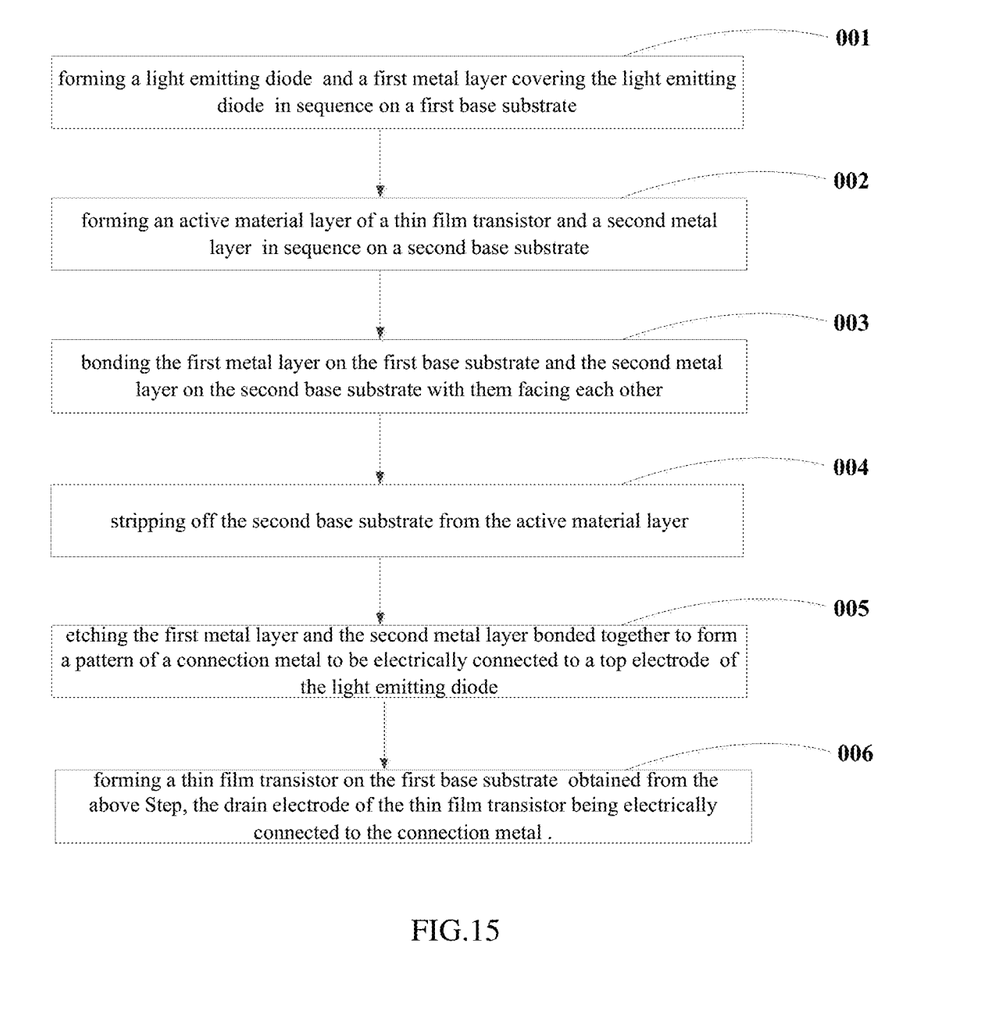
FIG. 15 is a flowchart of a manufacturing method of a display substrate according to an embodiment of the disclosure.

As shown in FIGS. 13 and 14, in the embodiment of the disclosure, the low temperature polysilicon thin film transistor comprises a first buffer layer 8, a low temperature polysilicon active layer 9, a gate insulation layer 11, a drain electrode 7, a gate electrode 12, an interlayer insulation layer 13, and a source electrode 14 disposed in sequence in a direction away from the connection metal 3.

The source electrode 14 is connected to the low temperature polysilicon active layer 9 by a first via hole 15 in the gate insulation layer 11 and the interlayer insulation layer 13; the drain electrode 7 is disposed on a side of the low temperature polysilicon active layer 9 away from the first buffer layer 8 and is electrically connected to the connection metal 3.

This arrangement can avoid forming via holes in the gate insulation layer 11 and the interlayer insulation layer 13 for connecting the drain electrode 7 and the low temperature polysilicon active layer 9 and for connecting the drain electrode 7 and the connection metal 3, which can reduce difficulty in the manufacturing process of the substrate, to improve the product yield.

As shown in FIG. 7, in another optional embodiment of the disclosure, the display substrate further comprises a first planarization layer 18, a white fluorescent layer 19, a filter layer 20, and a second planarization layer 23 disposed in sequence in a direction away from the thin film transistor 5, and the filter layer 20 comprises color filters 21 and a black matrix 22 defining adjacent color filters 21 for the respective pixel units.

As shown in FIG. 8, in further another optional embodiment of the disclosure, the light emitting diode 2 is a miniature blue light emitting diode, and the display substrate further comprises a first planarization layer 18, a quantum dot material structure layer 29 and a second planarization layer 23 disposed in sequence in a direction away from the thin film transistor 5. The quantum dot material structure layer comprises, for each of the pixel units, a first color light region 30, a second color light region 31, and a third color light region 32, and a black matrix 22 for defining the first light region 30, the second color light region 31 and the third color light region 32 which are adjacent to each other. The first color light region 30 is provided with a green light quantum dot material structure layer, and the second color light region 31 is provided with a red light quantum dot material structure layer.

For example, all of the white fluorescent layer, the filter layer, and the quantum dot material layer described above are examples of a light conversion layer. For example, because the light emitting diode which is epitaxially grown can be a monochromatic diode, the light conversion layer can convert the monochromatic light emitted by the monochromatic diode into light with another color or into light with different colors.

Based on a same inventive concept, an embodiment of the disclosure further provides a display apparatus including a display substrate as any one of the above display substrates.

A size of the light emitting diode of the display apparatus of the technical solution can be smaller, and the product yield and the resolution of the display apparatus can be higher.

As shown in FIGS. 1 to 15, based on a same inventive concept, an embodiment of the disclosure further provides a manufacturing method of a display substrate, comprising following steps 001-006.

Figure 1:
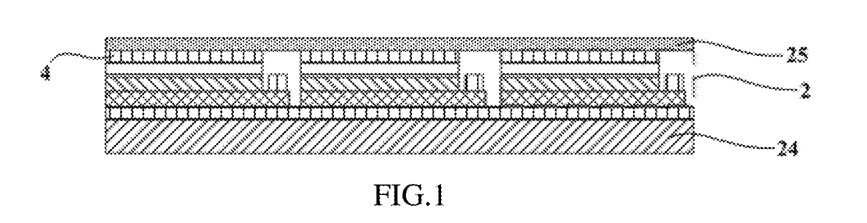
FIG. 1 is a schematic structural diagram of a light emitting diode according to an embodiment of the disclosure.

Step 001: as shown in FIG. 1, forming a light emitting diode 2 and a first metal layer 25 covering the light emitting diode 2 in sequence on a first base substrate 24.

Figure 2:
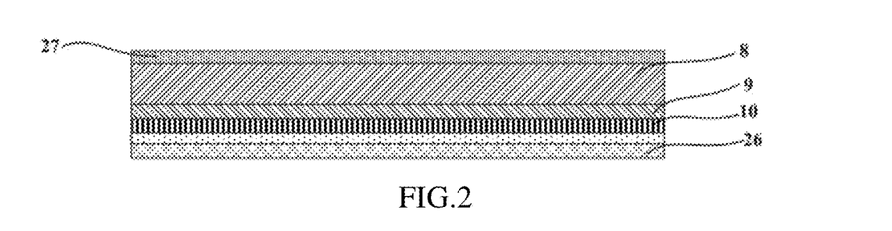
FIG. 2 is a schematic structural diagram of a display substrate according to an embodiment of the disclosure.

Step 002: as shown in FIG. 2, forming an active material layer of a thin film transistor and a second metal layer 27 in sequence on a second base substrate 26. For example, an example of the active material layer herein can be the low temperature polysilicon active layer 9 described above. In addition, a first buffer layer 8 and a second buffer layer 10 can also be formed on both sides of the active material layer. For example, a material of the first buffer layer 8 and the second buffer layer 10 are both an insulation material, and the first buffer layer 8 can prevent the active material layer from being connected to the second metal layer 27.

Figure 3:
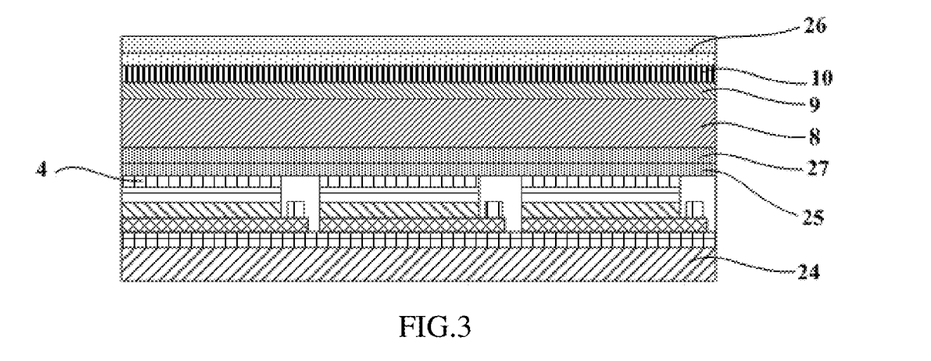
FIG. 3 is a schematic structural diagram of a display substrate according to another embodiment of the disclosure.

Step 003: as shown in FIG. 3, bonding the first metal layer 25 on the first base substrate 24 and the second metal layer 27 on the second base substrate 26 to be opposite to each other. For example, in the step, the first metal layer 25 and the second metal layer 27 are bonded to face each other.

Figure 4:
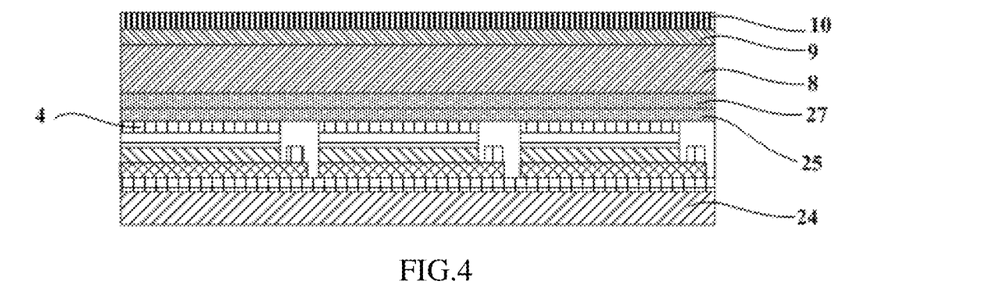
FIG. 4 is a schematic structural diagram of a display substrate according to further another embodiment of the disclosure.

Step 004: as shown in FIGS. 4 and 8, stripping off the second base substrate 26. For example, the second base substrate 26 is stripped off in this step. A method of stripping off the second base substrate 26 is not particularly limited. For example, a sacrifice layer can be formed between the second base substrate 26 and the active material layer. When the second base substrate is stripped off, the sacrifice layer can be decomposed or melted by means such as laser irradiation or heating, etc., so that the second base substrate can be stripped off.

Figure 5:
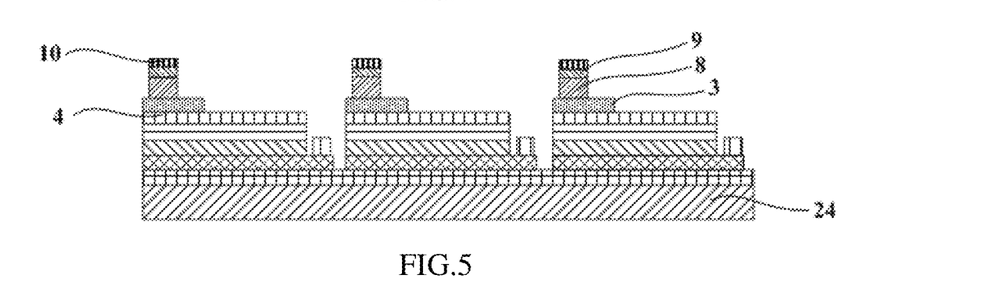
FIG. 5 is a schematic structural diagram of a display substrate according to an embodiment of the disclosure.
Figure 9:
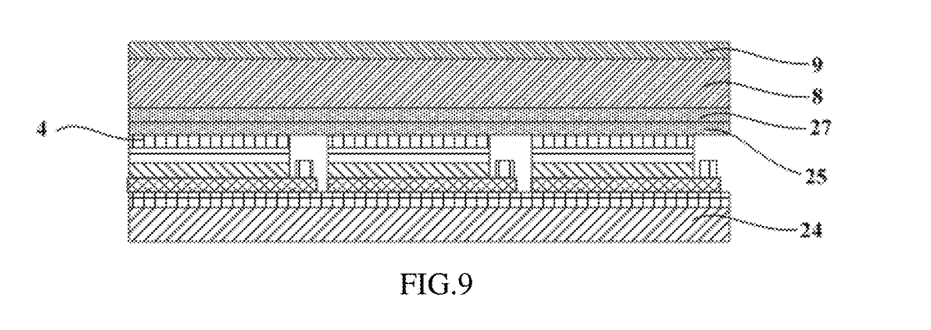
FIG. 9 is a schematic structural diagram of a display substrate according to another embodiment of the disclosure.

Step 005: etching the first metal layer 25 and the second metal layer 27 bonded together to form a pattern of a connection metal 3 to be electrically connected to a top electrode 4 of the light emitting diode 2. A structure of the pattern is shown in FIGS. 5 and 9.

Step 006: forming a thin film transistor 5 on the first base substrate 24 obtained from step 005. A drain electrode 7 of the thin film transistor 5 is electrically connected to the connection metal 3, as shown in FIGS. 6, 7, 10, and 11. In addition, an active layer of the thin film transistor 5 can be formed by patterning an active material layer.

In some examples, forming the light emitting diode on the first base substrate comprises epitaxially growing a light emitting layer on the first base substrate. For example, a material of the light emitting layer comprises an inorganic semiconductor material. During forming the light emitting diode, it can further comprise a step of growing an n-type contact layer, a p-type contact layer, and a buffer layer. In addition, it can further comprise a process of forming an n-side electrode and a p-side electrode. For example, one of the n-side electrode and the p-side electrode can be the top electrode of the above-mentioned light emitting diode.

As shown in FIGS. 5-8, an area of the connection metal 3 can be smaller than an area of the top electrode 4 of the light emitting diode. In this way, after the connection metal 3 is formed on the top electrode 4, the top electrode can be prevented from being completely blocked to affect light output of the light emitting diode. For example, the area of the connection metal 3 is smaller than ¼ of the area of the top electrode 4. For example, the area of the connection metal 3 can be made as small as possible under a condition of satisfying electrical conduction performance.

When the display substrate is manufactured by using manufacturing method of the display substrate of the technical solution, the light emitting diode 2 and the first metal layer 25 covering the light emitting diode 2 are formed on the first base substrate 24, the active material layer and the second metal layer 27 of the thin film transistor 5 is formed on the second base substrate 26, and then the two metal layers are attached with them facing each other. Because both of the metal layers are integrally formed on the respective base substrates, it is less difficult to align the two metal layers when they are attached and thus the alignment accuracy is required to be low. When the display substrate is manufactured by the manufacturing method of the technical solution, it is not necessary to align and attach the finished light emitting diode 2 and thin film transistor 5 during manufacturing the display apparatus, to avoid alignment between the light emitting diode 2 and the thin film transistor 5, so that the size of the light emitting diodes 2 is not required to large, and the product yield of the display substrate and the resolution of the display apparatus are enhanced.

Figure 6:
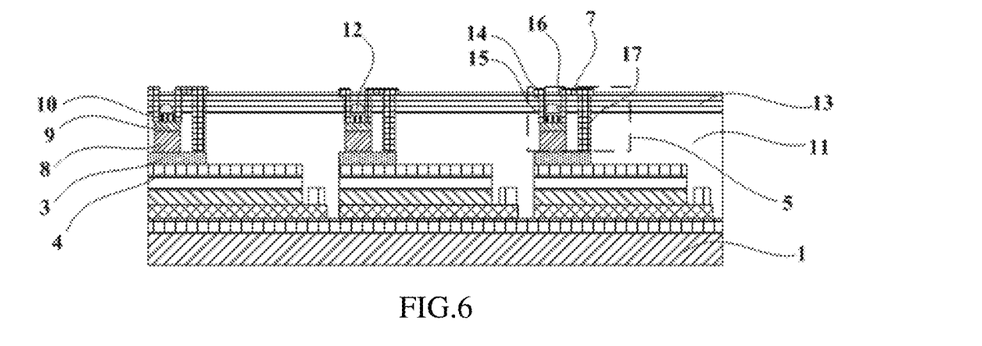
FIG. 6 is a schematic structural diagram of a display substrate according to another embodiment of the disclosure.

As shown in FIGS. 5 and 6, in an embodiment of the disclosure, the thin film transistor 5 is a low temperature polysilicon thin film transistor, and for example forming the thin film transistor 5 on the first base substrate 24 comprises: etching an active material layer, to form the active layer 6 which is spaced and insulated from the connection metal 3 (refer to FIG. 7); forming a gate insulation layer 11 on the active layer 6; forming a pattern of a gate electrode 12 on the gate insulation layer 11; forming an interlayer insulation layer 13 on the pattern of the gate electrode 12; forming a first via hole 15 for electrically connecting the source electrode 14 to the active layer 6 in the gate insulation layer 11 and the interlayer insulation layer 13; forming a second via hole 16 for electrically connecting the drain electrode 7 to the active layer 6 and a third via hole 17 for electrically connecting the drain electrode 7 to the connection metal 3 in the gate insulation layer 11 and the interlayer insulation layer 13; forming a pattern of the source electrode 14 and a pattern of the drain electrode 7 on the interlayer insulation layer 3.

Figure 10:
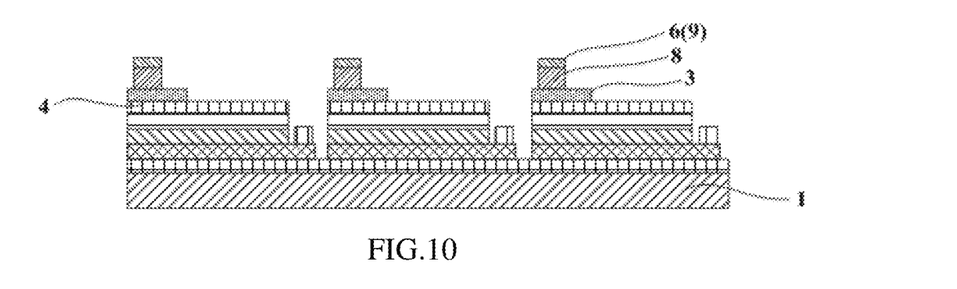
FIG. 10 is a schematic structural diagram of a display substrate according to further another embodiment of the disclosure.
Figure 11:
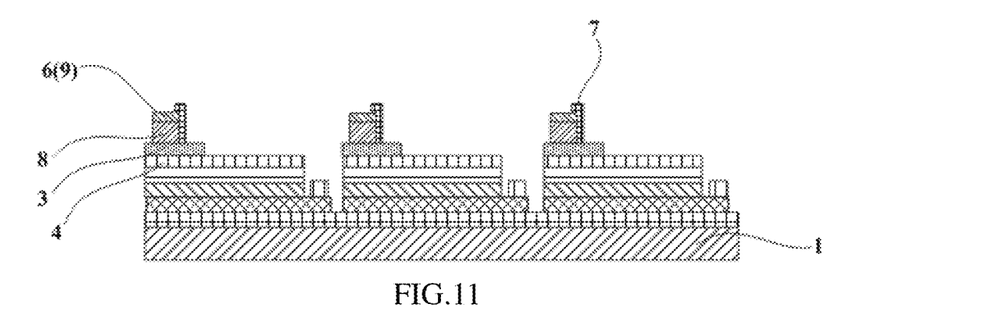
FIG. 11 is a schematic structural diagram of a display substrate according to an embodiment of the disclosure.

As shown in FIGS. 10 to 12, in an optional embodiment of the disclosure, the thin film transistor is a low temperature polysilicon thin film transistor. Forming the thin film transistor on the first base substrate 24 comprises, for example, etching an active material layer to form the active layer 6 which is spaced and insulated from the connection metal 3; forming a pattern of the drain electrode 7 to be connected to the active layer 6 and the connection metal 3; forming a gate insulation layer 11 on the drain electrode 7; forming a pattern of the gate electrode 12 on the gate insulation layer 11; forming an interlayer insulation layer 13 on the pattern of the gate electrode 12; forming a first via 15 for electrically connecting the source electrode 14 to the active layer 6 in the gate insulation layer 11 and the interlayer insulation layer 13; forming a pattern of the source electrode 14 on the interlayer insulation layer 13.

By using the above method, it is possible to avoid forming the via holes for connecting the drain electrode 7 to the low temperature polysilicon active layer 9 and for connecting the drain electrode 7 to the connection metal 3 in the gate insulation layer 11 and the interlayer insulation layer 13, to reduce the difficulty in the manufacturing process of the substrate and improve the product yield.

As shown in FIGS. 7 and 13, in an optional embodiment of the disclosure, the method further comprises: forming a first planarization layer 18 on the interlayer insulation layer 13; forming a white fluorescent layer 19 on the first planarization layer 18; forming a filter layer 20 on the white fluorescent layer 19, wherein the filter layer 20 comprises, for the respective pixel units, color photoresistors 21 and a black matrix 22 defining adjacent color filters 21; forming a second planarization layer 23 on the filter layer 20.

As shown in FIGS. 8 and 14, in another optional embodiment of the disclosure, the light emitting diode 2 is a blue light emitting diode, and the method further comprises: forming a first planarization layer 18 on the interlayer insulation layer 13; and forming a quantum dot material structure layer 29 on the first planarization layer 18, wherein the quantum dot material structure layer 29 comprises, for each of the pixel units, a first color light region 30, a second color light region 31, and a third color light 32, as well as a black matrix 22 for defining the first color light region 30, the second color light region 31 and the third color light region 32 which are adjacent to each other, the first color light region 30 is provided with a green light quantum dot material structure layer, and the second color light region 31 is provided with a red light quantum dot material structure layer; forming a second planarization layer 23 on the quantum dot material structure layer 29.

The specific type of the display apparatus is not limited. For example, the display apparatus can be a VR device, an AR device, a mobile phone, a notebook computer, an e-book, a tablet computer, etc.

What are described above is related to the illustrative embodiments of the disclosure only and not limitative to the scope of the disclosure, the scopes of the disclosure are defined by the accompanying claims.

The invention claimed is:

1. A manufacturing method of a display substrate comprising:
   forming a light emitting diode and a first metal layer covering the light emitting diode in sequence on a first base substrate;
   forming an active material layer and a second metal layer in sequence on a second base substrate;
   bonding the first metal layer on the first base substrate and the second metal layer on the second base substrate with them facing each other;
   stripping off the second base substrate;
   patterning the first metal layer and the second metal layer to form a connection metal pattern to be electrically connected to a top electrode of the light emitting diode; and
   forming a thin film transistor on the first base substrate, wherein an active layer of the thin film transistor is formed by patterning the active material layer, and a drain electrode of the thin film transistor is electrically connected to the connection metal pattern.

2. The manufacturing method of claim 1, wherein forming the light emitting diode on the first base substrate comprises epitaxially growing a light emitting layer on the first base substrate.

3. The manufacturing method of claim 2, wherein the light emitting layer comprises an inorganic semiconductor material.

4. The manufacturing method of claim 1, wherein an area of the connection metal pattern is smaller than an area of the top electrode of the light emitting diode.

5. The manufacturing method of claim 1, wherein forming the thin film transistor on the first base substrate comprises:
   patterning the active material layer to form the active layer;
   forming a gate insulation layer on the active layer;
   forming a gate electrode on the gate insulation layer;
   forming an interlayer insulation layer on the gate electrode;
   forming a first via hole and a second via hole for connecting to the active layer and a third via hole for connecting to the connection metal pattern, in the gate insulation layer and the interlayer insulation layer;
   forming a source electrode and the drain electrode on the interlayer insulation layer, wherein the source electrode is connected to the active layer through the first via hole, and the drain electrode is connected to the active layer through the second via hole and is connected to the connection pattern through the third via hole.

6. The manufacturing method of claim 1, wherein forming the thin film transistor on the first base substrate comprises:
   patterning the active material layer to form the active layer;
   forming a drain electrode to be connected to the active layer and the connection metal pattern;
   forming a gate insulation layer on the drain electrode;
   forming a gate electrode on the gate insulation layer;
   forming an interlayer insulation layer on the gate electrode;
   forming a first via hole for connecting to the active layer, in the gate insulation layer and the interlayer insulation layer; and
   forming a source electrode on the interlayer insulation layer, wherein the source electrode is connected to the active layer through the first via hole.

7. The manufacturing method of claim 1, further comprising forming a buffer layer between the active material layer and the second metal layer on the second base substrate,
   wherein the buffer layer and the active material layer are simultaneously patterned to form a buffer layer pattern, and the active layer is insulated from the connection metal pattern by the buffer layer pattern.

8. The manufacturing method of claim 1, further comprising:
   forming a first planarization layer on the thin film transistor;
   forming a light conversion layer on the first planarization layer.

9. The manufacturing method of claim 8, wherein the light conversion layer comprises a white fluorescent layer and a filter layer disposed in sequence on the first planarization layer, and the filter layer comprises a plurality of color filters with different colors.

10. The manufacturing method of claim 8, wherein the light conversion layer comprises a quantum dot structure layer, and the quantum dot material structure layer comprises a plurality of color light regions provided with quantum dot materials with different colors.

11. The manufacturing method of claim 8, further comprising forming a second planarization layer on the light conversion layer.

12. A display substrate, comprising: a base substrate and a plurality of pixel units disposed on the base substrate, wherein
   at least one of the plurality of the pixel units comprises a light emitting diode, a connection metal pattern, and a thin film transistor disposed in sequence in a direction away from the base substrate;
   the connection metal pattern is electrically connected to a top electrode of the light emitting diode; and
   an active layer of the thin film transistor is spaced and insulated from the connection metal pattern, and a drain electrode of the thin film transistor is electrically connected to the connection metal pattern, an orthographic projection of the connection metal pattern on the base substrate is within an orthographic projection of the top electrode on the base substrate, and both an orthographic projection of the drain electrode and an orthographic projection of a source electrode of the thin film transistor on the base substrate are within the orthographic projection of the connection metal pattern on the base substrate,
   wherein the thin film transistor is a low temperature polysilicon thin film transistor, the low temperature polysilicon thin film transistor comprises:
   a low temperature polysilicon active layer, a gate insulation layer, a gate electrode, an interlayer insulation layer, the source and drain electrodes disposed in sequence in a direction away from the connection metal pattern, wherein
   the source electrode is connected to the low temperature polysilicon active layer through a first via hole in the gate insulation layer and the interlayer insulation layer;
   the drain electrode is connected to the low temperature polysilicon active layer through a second via hole in the gate insulation layer and the interlayer insulation layer, and the drain electrode is electrically connected to the connection metal pattern through a third via hole in the gate insulation layer and the interlayer insulation layer.

13. The display substrate of claim 12, wherein the low temperature polysilicon thin film transistor comprises:
- a low temperature polysilicon active layer, a gate insulation layer, the drain electrode, a gate electrode, an interlayer insulation layer, and the source electrode disposed in sequence in a direction away from the connection metal pattern,
- wherein the source electrode is connected to the low temperature polysilicon active layer through a first via hole in the gate insulation layer and the interlayer insulation layer; the drain electrode is disposed on a side of the connection metal pattern away from the low temperature polysilicon active layer and is electrically connected to the connection metal pattern.

14. The display substrate of claim 12, further comprising: a first planarization layer and a light conversion layer disposed in sequence in a direction away from the thin film transistor.

15. The display substrate of claim 14, wherein the light conversion layer comprises a white fluorescent layer and a filter layer disposed in sequence on the first planarization layer, and the filter layer comprises a plurality of color filters with different colors.

16. The display substrate of claim 14, wherein the light conversion layer comprises a quantum dot structure layer, and the quantum dot material structure layer comprises a plurality of color light regions provided with quantum dot materials with different colors.

17. The display substrate of claim 12, wherein the light emitting diode is a blue light emitting diode.

18. A display apparatus comprising the display substrate according to claim 12.

* * * * *